(12) United States Patent
Müller et al.

(10) Patent No.: US 6,379,990 B1
(45) Date of Patent: Apr. 30, 2002

(54) METHOD OF FABRICATING A MICROMECHANICAL SEMICONDUCTOR CONFIGURATION

(75) Inventors: Karlheinz Müller, Waldkraiburg; Stefan Kolb, Unterschleissheim, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/348,160

(22) Filed: Jul. 6, 1999

Related U.S. Application Data

(63) Continuation of application No. PCT/DE98/00012, filed on Jan. 5, 1998.

(51) Int. Cl.[7] .............................................. H01L 21/00
(52) U.S. Cl. ...................... 438/53; 438/481; 438/495; 438/505; 438/745
(58) Field of Search ................................. 438/481, 483, 438/489, 493, 494, 495, 503, 504, 505, 735, 737, 739, 745, 749, 750, 751, 53; 73/514.36, 514.16

(56) References Cited

U.S. PATENT DOCUMENTS

| | | | |
|---|---|---|---|
| 4,744,863 A | * | 5/1988 | Guckel et al. .................. 438/53 |
| 5,216,490 A | * | 6/1993 | Greiff et al. ............... 73/514.35 |
| 5,242,863 A | * | 9/1993 | Xiang-Zheng et al. ......... 438/53 |
| 5,470,797 A | * | 11/1995 | Matrangelo .................... 438/53 |
| 5,510,276 A | * | 4/1996 | Diem et al. .................... 438/53 |
| 5,536,963 A | * | 7/1996 | Polla ........................... 257/417 |
| 5,677,560 A | * | 10/1997 | Zimmer et al. ............... 257/418 |
| 5,736,430 A | * | 4/1998 | Seefeldt et al. ................ 438/53 |
| 5,886,261 A | * | 3/1999 | Mueller et al. ........... 73/514.36 |

FOREIGN PATENT DOCUMENTS

| | | |
|---|---|---|
| DE | 4215722 A1 | 11/1993 |
| DE | 4309206 C1 | 9/1994 |
| DE | 19536228 A1 | 4/1997 |
| DE | 19536250 A1 | 4/1997 |
| EP | 0624900 A2 | 11/1994 |
| EP | 0747686 A1 | 12/1996 |

OTHER PUBLICATIONS

"Anwendungen für mikromechanische Komponenten", Menz, Bley Mirkosystemt. F.I. VCH Verlagsges. MbH, Weinheim, 1993, pp. 180–183.
Heuberger, Mikrom. Springer Verlag, Berlin, Heidelberg, 1989, pp. 349–355.

* cited by examiner

Primary Examiner—Carl Whitehead, Jr.
Assistant Examiner—Maria Guerrero
(74) Attorney, Agent, or Firm—Laurence A. Greenberg; Werner H. Stemer; Ralph E. Locher

(57) ABSTRACT

A membrane of the micromechanical semiconductor configuration is formed within a cavity. The membrane is formed by a crystalline layer within the substrate or within an epitaxial sequence of layers of the semiconductor configuration arranged on a substrate. The membrane is laid at the edge region on a support and is covered over by a covering layer supported on a counter-support. The support and the counter-support have a different etch rate from the membrane. Wet-chemical etching of the layer sequence with an etchant that is selective to the material of the membrane thus leads to the formation of a cavity around the membrane. Preferably, the layers are formed of differently doped materials.

8 Claims, 2 Drawing Sheets

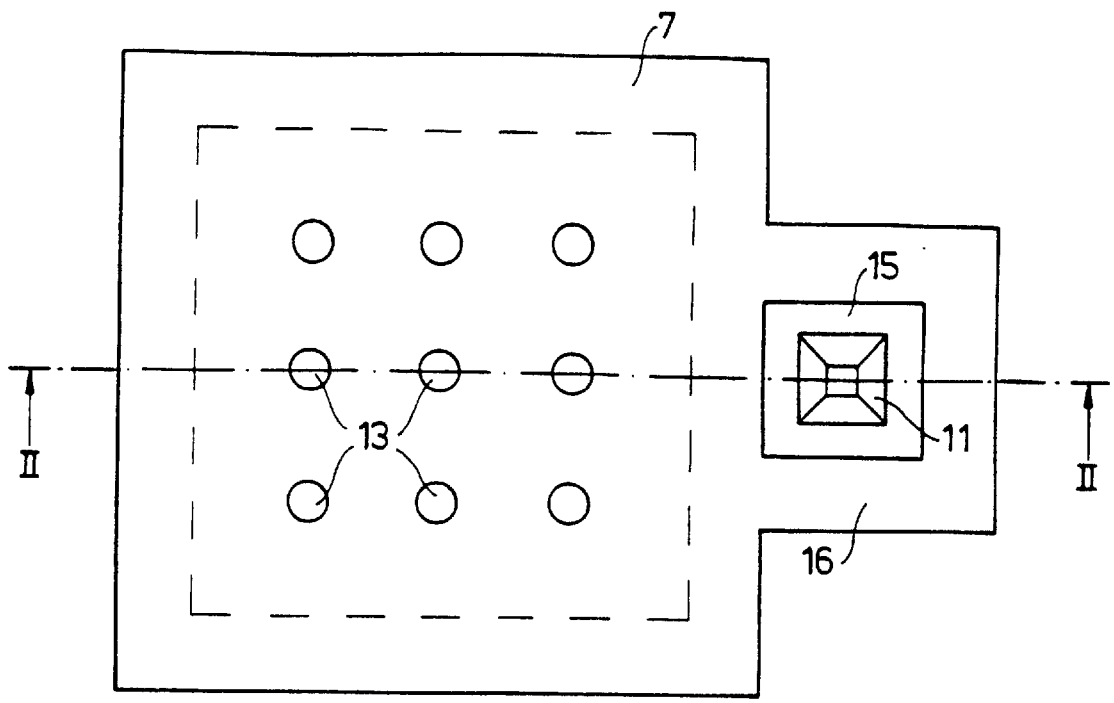
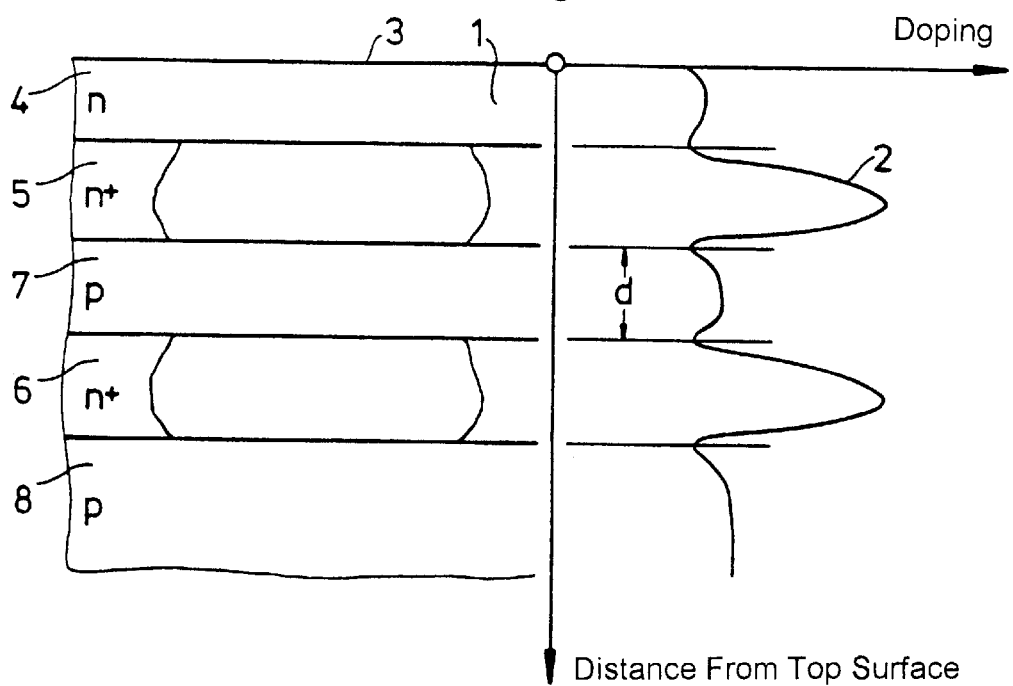

METHOD OF FABRICATING A MICROMECHANICAL SEMICONDUCTOR CONFIGURATION

CROSS-REFERENCE TO RELATED APPLICATION

This is a continuation of copending international application PCT/DE98/00012, filed Jan. 5, 1998, which designated the United States.

BACKGROUND OF THE INVENTION

Field of the Invention

The invention lies in the field of semiconductor technology. Specifically, the invention pertains to a method of fabricating a micromechanical semiconductor configuration with a thin membrane formed inside a cavity.

A micromechanical semiconductor configuration of that type is utilized, for example, as a semiconductor acceleration sensor for measuring accelerations. In that use the membrane together with counter-electrodes serves as a capacitor. Changes in the capacitance of the device are evaluated as the measured parameter. The membranes in the prior art are normally fixed through springs in the sensor. However, the process sequences during fabrication of the membrane lead to stress, especially mechanical stress in the membrane. In the event that relaxation through the springs is incomplete the membrane can be permanently deformed. In addition, forces taken up in the springs can lead to faulty behavior of the membrane during operation. In order to protect and mechanically stabilize these sensors, upper sealing plates, generally consisting of a polysilicon layer, are braced by means of nitride supports, for example. The sealing plates can also be formed by metallization and be supported with metallization supports. In each case, additional layers are necessary for the formation of the sensor.

SUMMARY OF THE INVENTION

It is accordingly an object of the invention to provide a method of fabricating a micromechanical semiconductor configuration, which overcomes the above-mentioned disadvantages of the heretofore-known devices and methods of this general type and which can be fabricated more simply and therefore more economically and which, at the same time, achieves improved mechanical and physical characteristics.

With the foregoing and other objects in view there is provided, in accordance with the invention, a method of fabricating a micromechanical semiconductor configuration, in particular a microelectronic integrated sensor device. The method comprises the following steps: forming an epitaxial layer sequence of individual crystalline layers on a substrate, the layer sequence including a support layer, a membrane layer, and a counter-support layer, and producing a doping profile with alternating or varied doping of the support layer, the membrane layer and the counter-support layer;

forming a membrane from the membrane layer in the layer sequence by at least regionally wet-chemically etching the support layer and the counter-support layer with an etching agent selective towards the membrane layer, and thereby forming a cavity in the layer sequence whereby an edge region of the membrane rests on a support formed by the support layer, and the membrane is covered with a covering layer supported on the counter-support layer.

According to an essential idea of the invention the membrane is formed through a crystalline layer within the substrate or within an epitaxial sequence off layers of the semiconductor configuration formed on a substrate. Thus fabrication of the micromechanical semiconductor configuration does not involve the use of any layers that are different from the layers normally used in the fabrication of semiconductors. Rather, the standard process used for conventional semiconductor components can also be taken over for the fabrication of a membrane in a cavity of the micromechanical semiconductor configuration, whereby simply minor process steps need to be inserted or amended.

The entire micromechanical semiconductor configuration is advantageously fabricated from a single combined crystalline semiconductor base material which can be either the actual substrate or an epitaxial series of layers arranged on a substrate.

In accordance with an added feature of the invention, the membrane layer, and thus the membrane, is formed of mono-crystalline silicon. In addition to the economical fabrication costs, the essential advantages lie above all in the use of an almost stress-free monocrystalline layer for the membrane and thus in an improvement in the mechanical and other physical properties.

In accordance with an additional feature of the invention, the membrane is doped differently from the support layer and the counter-support layer.

In a preferred implementation the membrane is laid at the edge region on a support and covered with a covering layer supported on the counter-support. The counter-support and covering layer hereby also function as lateral and upper limits of movement which are so arranged relative to the edge of the membrane that the membrane can move to compensate mechanical stress.

In an especially preferred embodiment of the invention the support, the membrane, the counter-support and the covering layer in that order are each fabricated through a crystalline layer within the substrate or within an epitaxial series of layers of the semiconductor configuration arranged on the substrate, whereby a doping profile is set up in the substrate or in the epitaxial series of layers such that at least the support and the counter-support, on the one hand, and the membrane, on the other, are sufficiently differently doped that in order to fabricate a cavity the layers surrounding the membrane can be wet chemically etched by means of a suitable selective etching solution. The doping profile can be set up either by subsequently performing one or several high-energy implantation steps, or already with the deposition of differently doped epitaxial layers. In a preferred embodiment the sequential layers of the substrate or the series of epitaxial layers are doped alternately high and low. Depending on the etching solution used, it is then possible through a subsequent wet chemical etching process to remove either the highly doped regions, for example using an HF—HNO$_3$—CH$_3$COOH etching solution, or to remove the low doped regions, for example by means of a KOH etching solution. This procedure exploits the selectivity of the respective wet chemical etching process between layers with high-level doping and layers with low-level doping, whereby selectivities of approximately 50:1 can be achieved.

In addition, the sequential areas in the substrate or in the epitaxial series of layers can be alternately doped between p-doping and n-doping, which alternation offers the additional advantage of electrical separation of adjacent layers.

In accordance with another feature of the invention, the membrane is formed with etching holes. It is useful to provide etching holes in the membrane initially covering the supporting layer in order to enable the etching solution to penetrate into the layer lying below. For the same purpose the covering layer can also be provided with appropriate etching holes, whereby in order to form a completely closed cavity the holes are closed in a later process step, preferably by means of a free-flowing glass layer such as BPSG or similar.

In accordance with a further feature of the invention, the membrane is supported between the support and a counter-support formed by the counter-support layer.

In accordance with a concomitant feature of the invention, the support and/or the counter-support are formed to support an entire peripheral region of the membrane.

The micromechanical semiconductor configuration can be successfully employed in all areas where there is a requirement for micromechanical structures with membranes in cavities. In particular, the micromechanical semiconductor configuration according to the invention can be used as a semiconductor acceleration sensor or as a semiconductor micropump.

Other features which are considered as characteristic for the invention are set forth in the appended claims.

Although the invention is illustrated and described herein as embodied in a micromechanical semiconductor configuration and method for fabrication of a micromechanical semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic top plan view onto the micromechanical semiconductor configuration; and FIG. 4 is a schematic section taken through the epitaxial layer sequence arranged on a substrate and the associated doping profile according to a further exemplary embodiment of the invention.

DESCRIPTION OF THE PREFERRED EMBODIMENTS

Figure 1:
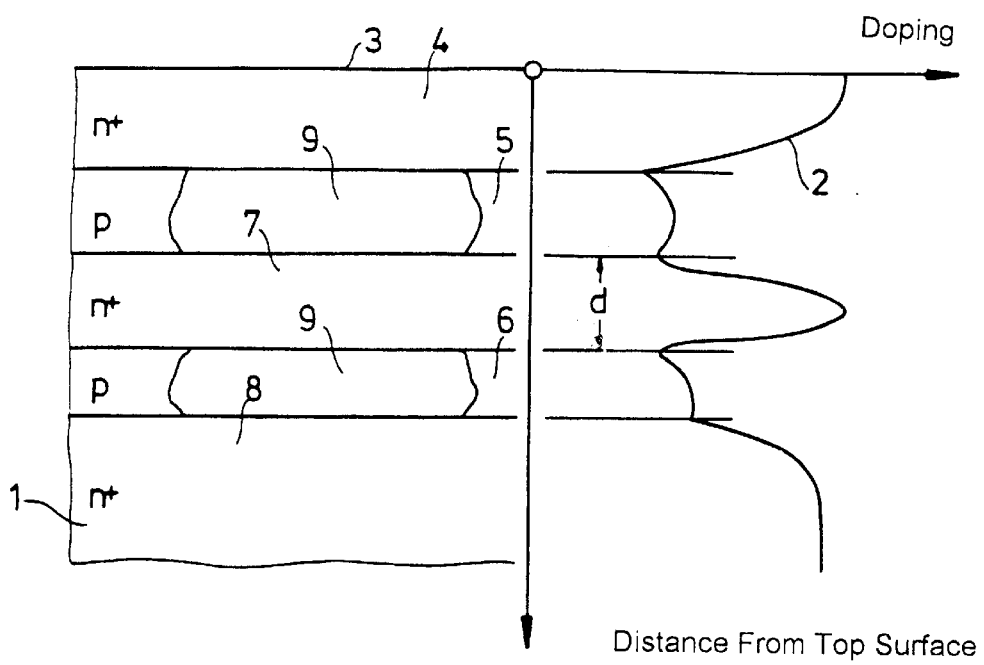
FIG. 1 is a schematic section through an epitaxial layer sequence arranged on a substrate, and the associated doping profile.

Referring now to the figures of the drawing in detail and first, particularly, to FIG. 1 thereof, there is illustrated the fabrication of a micromechanical semiconductor device according to a preferred embodiment of the invention. First, a doping profile 2 is generated in a monocrystalline semiconductor 1, preferably of silicon, by performing an appropriate number of high-energy implantation steps. Starting from a layer surface 3 of a semiconductor substrate 1 a region 4 for the formation of a later covering layer is $n^+$-doped; regions 5 and 6 for later formation respectively of a support and counter-support are p-doped; a membrane layer 7 of total thickness d is $n^+$-doped, and so is a remaining region 8 of the semiconductor substrate 1. In doing this it is useful to start from an $n^+$-doped semiconductor main body 8 and p-dope the region 5 and the region 6 by performing simply two implantation steps. In this procedure an implantation step includes a subsequent high temperature treatment for recrystallization of the doped region and activation of the dopant. In an alternative fabrication of the layer sequence illustrated in FIG. 1, the additional layers 6, 7, 5 and 4 can be applied epitaxially with the required doping to an initial $n^+$-doped monocrystalline semiconductor main body 8. In both cases a monocrystalline series of layers with the doping profile shown in FIG. 1 is produced, from which series of layers the thin membrane 7 arranged within a cavity 9 can be fabricated in a subsequent process step through wet chemical etching.

Figure 2:
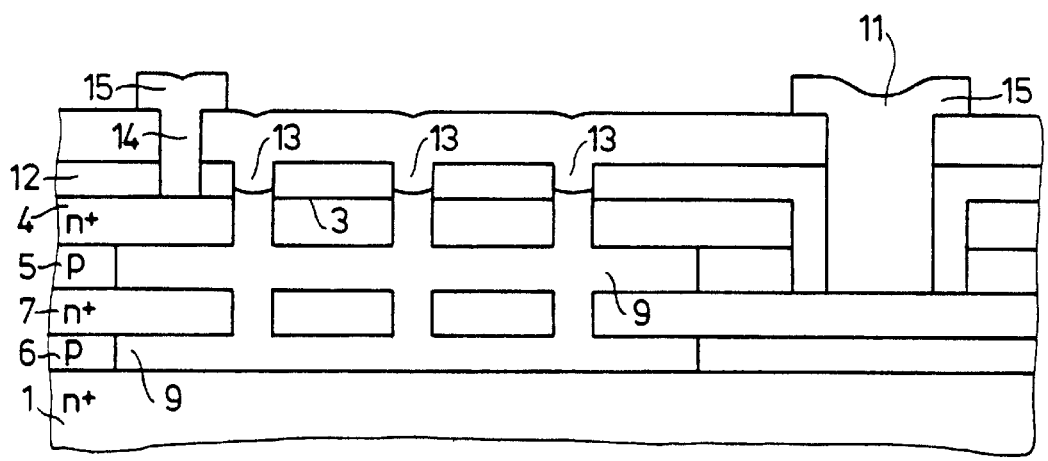
FIG. 2 is a schematic sectional view of a micromechanical semiconductor configuration towards the end of the fabrication process.

Referring now to FIG. 2, a contact hole 11 is produced by means of intrinsically known photolithographic and etching steps at those locations at which contact terminals for the electrical connection of the membrane 7 are planned. Next, an insulation layer 12 preferably consisting of silica is deposited over the entire area and etched back to remove the material lying on the floor of the contact hole 11. In the next step a further photolithographic process is used to structure the insulation layer 12, i.e. to equip it with openings 13 which are copied onto the layers 4, 5 and 7 in a subsequent anisotropic dry etching step. These etching openings enable penetration of the etching solution during the subsequent wet chemical etching steps and therewith the formation of the cavity 9 through isotropic etching of the layers 5 and 6. In the case of etching the low doped regions 5 and 6 a KOH solution, for example, is suitable, which is sufficiently selective towards the high level doped regions 4, 7 and 1 which should be etched not at all or in any case to only an insignificant extent.

After the membrane 7 has been fabricated inside the cavity 9 the no longer needed holes 13 in the region of the covering formed from the insulation layer 12 are covered over and sealed with an oxide or boron phosphorus silicate glass (BPSG). A further contact hole 14 is etched at a suitable position and a metallic contact 15 is led through this hole to the electrically conducting layer 4 lying beneath it. The sensor can now function as intended through the changing capacitances between the membrane 7 and the $n^+$-doped layer 4.

FIG. 3 shows a top view onto the sensor whereby the broken line shows the outer dimensions determined by the support layer 6. The counter-support layer covers both the edge region of the membrane 7 and also, illustrated at bottom right, the continuation 16 of the membrane 7 in which the contact hole 11 is disposed. In the central region of the membrane 7 the etching holes 13 are arranged which serve for passage of the etching solution for creating the cavity in the regions surrounding the membrane 7.

Referring now to FIG. 4, there is shown a further embodiment of a micromechanical semiconductor configuration according to the invention, with a thin membrane 7 formed within a cavity. The micromechanical semiconductor configuration has an alternative doping profile starting from a low p-doped silicon main body 8 and highly $n^+$-doped layers 5 and 6. For the wet chemical etching of the highly doped regions 5 and 6 an etching solution selective towards the low p-doped layer 7 of the membrane is suitable consisting, for example, of $HF—HNO_3—H_3COOH$.

We claim:

1. A method of fabricating a micromechanical semiconductor configuration, which comprises:

forming an epitaxial layer sequence of individual crystalline layers on a semiconductor substrate, the epitaxial layer sequence including a support layer, a membrane layer, and a counter-support layer, and producing a doping profile with alternating or varied doping of the support layer, the membrane layer and the counter-support layer;

forming a membrane in the epitaxial layer sequence by at least regionally wet-chemically etching the support layer and the counter-support layer with an etching agent selective towards the membrane layer, and thereby forming a cavity in the epitaxial layer sequence whereby an edge region of the membrane rests on a support formed by the support layer, and the membrane is covered with a covering layer supported on the counter-support layer.

2. The method according to claim 1, wherein the membrane layer is a monocrystalline silicon layer.

3. The method according to claim 1, which comprises doping the membrane differently from the support layer and the counter-support layer.

4. The method according to claim 1, which comprises forming the membrane with etching holes.

5. The method according to claim 1, which comprises forming the support of the support layer to support an entire peripheral region of the membrane.

6. The method according to claim 1, which comprises supporting the membrane between the support and a counter-support formed by the counter-support layer.

7. The method according to claim 1, which comprises forming the support and the counter-support to support an entire peripheral region of the membrane.

8. The method according to claim 1, wherein the membrane is a membrane of a microelectronic integrated sensor device.

* * * * *

UNITED STATES PATENT AND TRADEMARK OFFICE
CERTIFICATE OF CORRECTION

PATENT NO.    : 6,379,990 B1
DATED         : April 30, 2002
INVENTOR(S)   : Karlheinz Müller et al.

It is certified that error appears in the above-identified patent and that said Letters Patent is hereby corrected as shown below:

<u>Title page,</u>
Item [30] should read as follows:
-- Jan. 3, 1997     (DE) ................................ 197 00 290.0 --

Signed and Sealed this

Eighteenth Day of June, 2002

*Attest:*

*Attesting Officer*

JAMES E. ROGAN
*Director of the United States Patent and Trademark Office*